United States Patent [19]

Fujita et al.

[11] Patent Number: 4,756,792
[45] Date of Patent: Jul. 12, 1988

[54] METHOD FOR VAPOR-PHASE EPITAXIAL GROWTH OF A SINGLE CRYSTALLINE-, GALLIUM ARSENIDE THIN FILM

[75] Inventors: Hisanori Fujita, Ushiku; Masaaki Kanayama, Tsuchiura, both of Japan

[73] Assignees: Mitsubishi Monsanto Chemical Co., Ltd.; Mitsubishi Chemical Inds. Ltd., both of Tokyo, Japan

[21] Appl. No.: 904,178

[22] Filed: Sep. 5, 1986

[30] Foreign Application Priority Data

Sep. 9, 1985 [JP] Japan .................................. 60-198904

[51] Int. Cl.$^4$ ...................... C30B 25/12; C30B 25/22
[52] U.S. Cl. .................................... 156/610; 156/613; 156/614; 156/DIG. 70; 252/62.36 A
[58] Field of Search ....... 156/610, 613, 614, DIG. 70; 427/84; 252/62.36 A; 148/DIG. 56

[56] References Cited

U.S. PATENT DOCUMENTS

| | | | |
|---|---|---|---|
| 3,762,945 | 10/1973 | DiLorenzo | 427/84 |
| 3,836,408 | 9/1974 | Kasano | 252/62.36 A |
| 3,904,449 | 9/1975 | DiLorenzo et al. | 252/62.36 A |
| 3,925,119 | 12/1975 | Philbrick et al. | 156/DIG. 70 |
| 4,407,694 | 10/1983 | Eu et al. | 156/613 |
| 4,419,179 | 12/1983 | Nogami | 156/DIG. 70 |

FOREIGN PATENT DOCUMENTS

| | | | |
|---|---|---|---|
| 55-77131 | 6/1980 | Japan . | |
| 57-111016 | 7/1982 | Japan | 156/610 |

Primary Examiner—John Doll
Assistant Examiner—Robert M. Kunemund
Attorney, Agent, or Firm—Burgess, Ryan & Wayne

[57] ABSTRACT

In a GaAs epitaxial wafer including, for example, two epitaxial layers having high and low carrier concentrations, the carrier concentration of the low carrier concentration layer is liable to greatly vary, so that wafers suitable for FETs and Schottky barrier diodes operated at UHF and SHF are produced at only a low yield. This drawback is eliminated by adjusting the heating temperature of GaAs substrate to 690° to 730° C. during the growth of the low carrier concentration layer.

11 Claims, No Drawings

METHOD FOR VAPOR-PHASE EPITAXIAL GROWTH OF A SINGLE CRYSTALLINE-, GALLIUM ARSENIDE THIN FILM

BACKGROUND OF INVENTION

1. Field of the Invention

The present invention relates to a method for producing a gallium arsenide epitaxial wafer which is suitable for the production of a Schottky barrier diode, a field effect transistor (FET), and the like.

2. Description of the Related Arts

A single crystal of gallium arsenide (hereinafter referred to as GaAs) exhibits a higher mobility of electrons than a silicon single crystal, and therefore, is widely used for such devices as FETs, Schottky barrier diodes and the like operated at a high frequency region, particularly UHF and SHF regions.

An epitaxial wafer is used, for those devices, in which, for example, two single crystalline GaAs layers having low and high carrier-concentrations, respectively, are formed on a single crystalline GaAs substrate. The thickness and carrier concentrations of the two single crystalline layers are strictly controlled, and further, the carrier concentrations are steeply changed at the boundary of the two single crystalline layers.

Heretofore, proposals have been made for the provision of such epitaxial wafers. Namely, the amount of impurities fed, which determine the carrier concentrations, and the proportion of the amounts of gallium and arsenic fed are controlled. According to one of the proposals disclosed in Japanese Unexamined Patent Publication No. 55-77131, the feeding of impurities is interrupted during growth of the low carrier-concentration layer and the ratio of the amounts fed of elements of the IIIb and Vb group of the Periodic Table is controlled to be greater than 1.

The low carrier concentration-layer involves problems in that the carrier concentration thereof may vary due to the influence of the impurity concentration of the metallic gallium and arsine, i.e., the starting materials of GaAs, various crystal defects generated during the epitaxial growth, and other factors. These problems are not satisfactorily solved even by the method disclosed in Japanese Unexamined Patent Publication No. 55-77131.

The variance of carrier concentration of the low carrier concentration layer must be controlled within a predetermined value, for example, 10%. When producing epitaxial wafers for Schottky barrier diodes, such a variance of 10% or less has been attained at a ratio of 50% or less based on the number of production runs.

SUMMARY OF THE INVENTION

It is an object of the present invention to provide a method for vapor-phase epitaxial growth of a single crystalline GaAs thin film, which method attains an improved reproducibility of the carrier concentration of a low carrier-concentration layer, that is, a small variance of the carrier concentration during production runs.

In accordance with the objects of the present invention, there is provided a method for a vapor-phase epitaxial growth for forming plurality layers of n type GaAs single crystalline films on a single crystalline GaAs substrate, wherein a low carrier concentration-layer is formed by adjusting [Ga]/[As], i.e., the ratio of the number of Ga atoms to the number of As atoms contained in the unit volume of gases used for vapor phase epitaxial growth, to be greater than 1, and a high carrier concentration-layer is formed by adjusting the [Ga]/[As] to be smaller than 1; characterized in that the temperature of a single crystalline substrate is held within a range of from 690° to 730° C. during the growth of a low carrier concentration-layer.

DESCRIPTION OF THE PREFERRED EMBODIMENTS

The single crystalline GaAs substrate used in the present invention is cut from a GaAs single crystal. A single crystalline GaAs thin film having an excellent surface state is obtained, when the GaAs substrate has an orientation of {100} plane and an off angle of from 0° to 10°, preferably from 1.5° to 5°. The single crystalline substrate is usually approximately 0.3~0.5 mm thick. The single crystalline GaAs substrate used in the present invention is produced by the liquid encapusulated Czochlarsky (LEC) method, the boat growth method, and the like.

The vapor phase epitaxial growth method is appropriate for forming the thin film of single crystalline GaAs, because the surface of an epitaxial wafer becomes flat, and the thickness of the constituent layers of a thin film is easily and accurately controlled.

The gas compositions generally used for the vapor phase growth are those used for the halide transfer method, such as the Ga—HCl—As—$H_2$ system and Ga—HCl—$AsH_3$—$H_2$ system. The gas composition used for the organic metal method (MOCVD) method, such as $GaR_3$ (R=$CH_3$, $C_2H_5$)—$AsH_3$—$H_2$ and the like can be also used, since both the composition and thickness thereof can be easily controlled.

In the epitaxial wafer used for FET's a low carrier concentration-layer is epitaxially grown on the semi-insulative, single crystalline GaAs substrate, and a high carrier concentration-layer is epitaxially grown on the low carrier concentration layer. The n type carrier concentration of the low carrier concentration layer is usually $1 \times 10^{15}$ cm$^{-3}$ or less, and the n type carrier concentration of the high carrier concentration layer is usually in the range of from $1 \times 10^{17}$ $^{1}$~$\times 10^{19}$ cm$^{-3}$.

In the epitaxial wafer used for a Schottky barrier diode, high and low carrier concentration layers are successively, epitaxially grown on the n type single crystalline GaAs substrate. The carrier concentration of the high carrier concentration layer is usually from $1 \times 10^{18}$ to $1 \times 10^{19}$ cm$^{-3}$, and the carrier concentration of the low carrier concentration layer is usually from $1 \times 10^{16}$ to $1 \times 10^{18}$ cm$^{-3}$.

The present invention is also applicable to the production of an epitaxial wafer including more than two layers of a thin film having different carrier concentrations.

In order to carry out the growth of a layer having a carrier concentration of approximately $10^{16}$ cm$^{-3}$ or more, the n type impurities, such as sulfur, silicon, selenium, and tellurium, are doped to adjust the carrier concentration. In order to carry out the growth of a layer having a carrier concentration of approximately $5 \times 10^{15}$ cm$^{-3}$ or less, the doping by n-type impurities is usually not carried out.

The temperature of a single crystalline substrate is maintained within a range of from 690° to 730° C., preferably from 700° to 730° C., during the growth of a low carrier concentration layer. When the temperature of a single crystalline substrate is less than 690° C., crystal defects increase in a layer growth thereon. On the other hand, when the temperature of a single crystalline substrate is more than 730° C., the carrier concentration disadvantageously greatly varies from run to run.

It is necessary to maintain the [Ga]/[As] (the ratio of the number of the Ga atoms to the number of As atoms contained in unit volume of gases used for the vapor phase growth) greater than 1, preferably from 2 to 10, more preferably from 3 to 8. Otherwise, the carrier concentration is not satisfactorily lessened, to provide a low carrier concentration-layer.

In the halide transfer method, HCl is caused to stoichiometrically react with the gallium to form GaCl, and the HCl therefore transfers to the gallium.

The mole concentration of HCl for transferring the gallium therefore can be used as the mole concentration of the gallium compound.

The temperature of a single crystalline substrate is held preferably in the range of from 735° to 830° C., more preferably in the range of from 735° to 760° C., during the growth of a high carrier concentration-layer. The [Ga]/[As] must be smaller than 1, otherwise the carrier concentration is not satisfactorily enhanced to provide a high carrier concentration layer. The [Ga]/[As] is preferably from 0.1 to 0.8, more preferably from 0.2 to 0.5.

A vapor phase growth apparatus used for carrying out the method according to the present invention may be vertical type or horizontal type and is not specifically limited.

According to the method of present invention, the epitaxial wafers can be industrially produced such that the carrier concentration of a low carrier concentration layer is kept within ±10% of a predetermined carrier concentration in each production run. This leads to an enhancement of the productivity of epitaxial wafers.

The present invention is further described by way of examples.

Although ten runs are carried in the examples, more than ten runs can be carried out while attaining improved reproducibility of carrier concentration of the low carrier concentration layer.

In the Examples and Comparative Examples hereunder, the thickness of each layer of a single crystalline GaAs film was measured by using a driller for measuring the film thickness (K-69J150 type produced by Kyowa Riken Co., Ltd.). The carrier concentration was measured by the C-V method.

EXAMPLE 1

A single crystalline GaAs substrate was used having a $1.5 \times 10^{18}$ cm$^{-3}$ of concentration of n type doped Si carriers, an off angle of 2° slanted from the (100) plane to the [011] direction, and a thickness of 0.35 mm.

The above single crystalline substrate was placed in a horizontal reactor made of quartz and provided with conduits for introducing hydrogen gas, AsH$_3$ gas, and HCl gas, respectively, and having a gallium boat mounted therein. The air in the reactor was replaced with nitrogen and, subsequently, the temperature of the reactor was raised while flowing the hydrogen gas at a rate of 2000 ml/minute. When the temperature of the gallium boat, reached 850° C. and the temperature of the substrate reached 750° C., HCl gas for etching was fed into a reactor at a rate of 25 ml/minute for a period of minute, to etch the substrate surface.

Subsequently, the reactor was fed with hydrogen gas containing 10% by weight of AsH$_3$ at a rate of 300 ml/minute, HCl gas for reacting with Ga in the boat at a rate of 10 ml/minute, and hydrogen gas containing 30 weight ppm of SiH$_4$ at a rate of 40 ml/minute for a period of 25 minutes, so as to form a high carrier concentration layer. In the formation of the high carrier concentration layer, the [Ga]/[As] was 0.3 and the substrate temperature was 750° C.

Subsequently, the feeding of the HCl for the gallium transfer and the feeding of the SiH$_4$ was interrupted for 15 minutes, and the substrate temperature was lowered to 720° C. during the interruption period. The flow rate of the hydrogen gas containing AsH$_3$ was decreased to 30 ml/minute, and HCl was fed at a rate of 25 ml/minute for 30 seconds to etch the substrate. The reactor was then fed for 5 minute with HCl for transferring the gallium at a rate of 12 ml/minute, and the hydrogen gas containing SiH$_4$ was fed at a rate of 2 ml/minute. The substrate temperature was maintained at 720° C. during the feeding of the hydrogen gas containing HCl and SiH$_4$. The low carrier concentration layer was grown at the maintained substrate temperature of 720° C. and the [Ga]/[As] was 4.

After growth of the low carrier concentration layer for 5 minutes, the feeding of the hydrogen gas containing HCl, AsH$_3$, and SiH$_4$ was interrupted and the reactor temperature was then lowered. When the temperature of the reactor's interior had fallen to room temperature, the epitaxial wafer including a grown, single crystalline thin film of GaAs was withdrawn from the reactor. The surfaces of the wafer obtained had a mirror-finish. The high carrier concentration layer was 4.8 μm thick, the low carrier concentration layer was 0.46 μm thick, and the boundary between these layers was 0.12 μm thick. The carrier concentrations were $1.3 \times 10^{18}$ cm$^{-3}$ for the high carrier concentration layer, and $1.5 \times 10^{17}$ cm$^{-3}$ for the low carrier concentration layer.

The above procedure was repeated for ten runs. In each run, the range of variance of the carrier concentration of the low carrier concentration-layer was within $0.1 \times 10^{17}$ cm$^{-3}$.

EXAMPLE 2

The procedure of Example 1 was carried out except that the interruption of the feeding of the hydrogen gas containing HCl and SiH$_4$ at the transition of growth from the high to low carrier concentration layers was not carried out. In this example, an epitaxial wafer for a Schottky barrier diode was produced.

The high carrier concentration layer of the wafer obtained was 4.9 μm thick, the low carrier concentration layer was 0.39 μm thick, and the boundary between the layers was 0.2 μm thick. The carrier concentration were $1.4 \times 10^{18}$ cm$^{-3}$ for the high carrier concentration layer, and $1.4 \times 10^{17}$ cm$^{-3}$ for the low carrier concentration layer.

The above procedure was repeated for ten runs. In each run, the range of variance of the carrier concentration of the low carrier concentration layer was within $0.1 \times 10^{17}$ cm$^{-3}$.

COMPARATIVE EXAMPLE 1

The procedure of Example 1 was repeated for the production of an epitaxial wafer used for a Schottky barrier diode, except that the substrate temperature was 760° C. during the growth of the low carrier concentration layer.

The high carrier concentration layer of the epitaxial wafer obtained was 0.44 μm thick, the low carrier concentration layer was 0.13 μm thick, and the boundary between these layers was 0.13 μm thick. The carrier concentrations were $1.6 \times 10^{18}$ cm$^{-3}$ for the high carrier concentration layer and $1.5 \times 10^{17}$ cm$^{-3}$ for the low carrier concentration layer.

The above procedure was repeated for ten runs. The carrier concentration of the low carrier concentration layer varied from $9 \times 10^{16}$ to $4 \times 10^{17}$ cm$^{-3}$.

EXAMPLE 3

In the same reactor as used in Example 1 was placed an undoped, semi-insulative, single crystalline GaAs substrate, the surface of which was polished and was slanted from the (100) plane to the [011] orientation by 2°.

The air in the reactor was replaced with nitrogen and, subsequently, the temperature of the reactor was raised while flowing the hydrogen gas at a rate of 2000 ml/minute. When the temperature of the gallium boat reached 850° C. and the temperature of the GaAs substrate reached 700° C., HCl was flown at a rate of 30 ml/minute for 1 minute to etch the surface of GaAs substrate. Subsequently, the reactor was fed, for 15 minutes, with the hydrogen gas containing 10% by weight of AsH$_3$ at a rate of 30 ml/minute, and HCl for the gallium transferring at a rate of 12 ml/minute, to grow an undoped layer (low carrier concentration layer). The [Ga]/[As] was 4.

Subsequently, the feeding of only the HCl for gallium transfer was interrupted, and the substrate temperature was raised to 750° C. When the substrate temperature reached 750° C., this temperature was maintained and the flow rate of the hydrogen gas containing AsH$_3$ was increased to 300 ml/minute. The HCl for etching was flown at a rate of 25 ml/minute for 15 seconds to etch the substrate surface. After completion of the etching the reactor was fed, for 3 minutes, with HCl for the gallium transfer at a rate of 10 ml/minute and the hydrogen gas containing 30 weight ppm of H$_2$S was fed at a rate of 2 ml/minute, to carry out the growth of the high carrier concentration layer. The [Ga]/[As] was 0.3.

The low carrier concentration layer of the wafer obtained was 1.9 μm thick, the high carrier concentration layer was 0.55 μm thick, and the boundary layer was 0.1 μm thick. The carrier concentrations were $3 \times 10^{14}$ cm$^{-3}$ for the low carrier concentration layer, and $2.3 \times 10^{17}$ cm$^{-3}$ for the high carrier concentration layer.

The above procedure was repeated for ten runs. The range of variance in the carrier concentration of low carrier concentration layer was within $0.3 \times 10^{14}$ cm$^{-3}$.

COMPARATIVE EXAMPLE 2

The procedure of Example 3 was repeated for producing a wafer for an FET, except that the substrate temperature was held at 750° C. during the growth of the low carrier concentration layer.

The low carrier concentration layer of the wafer obtained was 1.8 μm thick, the higher carrier concentration layer was 0.53 μm thick, and the boundary layer was 0.12 μm thick. The carrier concentrations were $3.5 \times 10^{14}$ cm$^{-3}$ for the low carrier concentration layer and $2.2 \times 10^{17}$ cm$^{-3}$ for the high carrier concentration layer.

The above procedure was repeated ten runs, and the carrier concentration of the low carrier concentration layers varied within the range of from $1 \times 10^{14}$ to $2 \times 10^{15}$ cm$^{-3}$.

As is apparent from the above Examples and Comparative Examples, the range of variance of the carrier concentration of a low carrier concentration layer can be lessened according to the present invention.

We claim:

1. A method for vapor-phase epitaxial growth of a single crystalline gallium arsenide thin film, wherein, on a single crystalline gallium arsenide substrate, said single crystalline gallium arsenide thin film consisting of a plurality of layers having carrier concentrations different from one another is epitaxially grown from a vapor phase, and further, a (Ga)/(As), which is a ratio of a number of gallium atoms to a number of arsenic atoms contained in unit volume of gases used for the vapor-phase epitaxial growth, is adjusted to be greater than 1 during growth of a layer(s) having a low carrier concentration and is adjusted to be smaller than 1 during growth of another layer(s) having a high carrier concentration, characterized in that, a temperature of said single crystalline gallium arsenide substrate is held at a first temperature of from 690° to 730° C. during formation of said low carrier concentration layer(s), and at a second temperature of from 735° to 830° C. during formation of a high carrier concentration layer(s).

2. A method according to claim 1, wherein a first temperature during forming of said low carrier concentration layer is from 700° to 730° C.

3. A method according to claim 1 or 2, wherein a second temperature during forming of said high carrier concentration layer is from 735° to 760° C.

4. A method according to claim 1, wherein a [Ga]/[As] is held in a range of from 2 to 10 during forming of said low carrier concentration layer.

5. A method according to claim 1, wherein a [Ga]/[As] is held in a range of from 0.1 to 0.8 during forming of said high carrier concentration layer.

6. A method according to claim 1, wherein said low carrier concentration layer has a carrier concentration of from $1 \times 10^{18}$ cm$^{-3}$ or less.

7. A method according to claim 6, wherein said low carrier concentration layer has a carrier concentration of $1 \times 10^{15}$ cm$^{-3}$ or less.

8. A method according to claim 7, wherein an epitaxial wafer consisting of said thin film and substrate is used for an FET.

9. A method according to claim 6, wherein said low carrier concentration layer has a carrier concentration of from $1 \times 10^{16}$ to $1 \times 10^{18}$ cm$^{-3}$.

10. A method according to claim 9, wherein an epitaxial wafer consisting of said thin film and substrate is used for a Schottky barrier diode.

11. A method according to claim 7 or 9, wherein said method is repeated at least ten times while maintaining gas phase-epitaxial conditions as constant, thereby obtaining a carrier concentration of said low carrier concentration layer which varies within ±10%.

* * * * *